US009921269B2

(12) United States Patent
Chen

(10) Patent No.: US 9,921,269 B2
(45) Date of Patent: Mar. 20, 2018

(54) COMPARISON DEVICE AND METHOD FOR COMPARING TEST PATTERN FILES OF A WAFER TESTER

(71) Applicant: King Yuan Electronics Co., Ltd., Hsinchu (TW)

(72) Inventor: Fu-Tai Chen, Hsinchu (TW)

(73) Assignee: KING YUAN ELECTRONICS CO., LTD., Hsinchu (TW)

( * ) Notice: Subject to any disclaimer, the term of this patent is extended or adjusted under 35 U.S.C. 154(b) by 341 days.

(21) Appl. No.: 14/543,167

(22) Filed: Nov. 17, 2014

(65) Prior Publication Data

US 2015/0074094 A1 Mar. 12, 2015

Related U.S. Application Data

(63) Continuation-in-part of application No. 12/929,839, filed on Feb. 18, 2011, now abandoned.

(30) Foreign Application Priority Data

Dec. 20, 2010 (TW) ................................ 99144726 A

(51) Int. Cl.

| | |
|---|---|
| ***G06F 7/00*** | (2006.01) |
| ***G06F 17/30*** | (2006.01) |
| ***G01R 31/3183*** | (2006.01) |
| ***G01R 31/3193*** | (2006.01) |

(52) U.S. Cl.
CPC ................ *G01R 31/318342* (2013.01); *G01R 31/31932* (2013.01)

(58) Field of Classification Search
CPC ........... G06F 17/30106; G06F 17/2785; G06F 17/30011; G06F 17/30067; G06F 17/30286; G06F 17/30061
See application file for complete search history.

(56) References Cited

U.S. PATENT DOCUMENTS

| | | | | |
|---|---|---|---|---|
| 5,890,177 A * | 3/1999 | Moody | G06F 17/24 | 715/210 |
| 6,560,620 B1 * | 5/2003 | Ching | G06F 17/27 | 707/999.202 |
| 8,413,123 B2 * | 4/2013 | Tanabe | G06F 8/445 | 382/303 |
| 8,862,556 B2 * | 10/2014 | Estes | G06F 17/2211 | 707/687 |

(Continued)

*Primary Examiner* — Daniel Kuddus
(74) *Attorney, Agent, or Firm* — Bacon & Thomas, PLLC

(57) ABSTRACT

A comparison device for comparing test pattern files of a wafer tester includes a storage unit and a processing unit. The comparison device stores a first to-be-compared file and a second to-be-compared file into the storage unit. The processing unit reads the first to-be-compared file and the second to-be-compared file from the storage unit to process and executes comparison operation, so as to generate a comparison result. The comparison operation compares the words in a first section of the first to-be-compared file with the words in a second section of the second to-be-compared file in a one-to-one manner, wherein, if the first section ending point is not the end of the first to-be-compared file or the second section ending point is not the end of the second to-be-compared file, the processing unit resets the first section and the second section, and executes comparison operation again.

13 Claims, 10 Drawing Sheets

(56) References Cited

U.S. PATENT DOCUMENTS

| | | | | |
|---|---|---|---|---|
| 2001/0042069 | A1* | 11/2001 | Petrov | G06F 8/54 |
| 2004/0030676 | A1* | 2/2004 | Wagner | G06F 11/3688 |
| 2005/0267885 | A1* | 12/2005 | Klier | G06F 17/2211 |
| 2011/0024653 | A1* | 2/2011 | Huber | E21B 47/18<br>251/11 |
| 2011/0078663 | A1* | 3/2011 | Huang | G06F 17/30876<br>717/126 |
| 2011/0138371 | A1* | 6/2011 | Tanabe | G06F 8/445<br>717/140 |
| 2011/0214125 | A1* | 9/2011 | Bando | G06F 9/30181<br>718/100 |
| 2013/0024653 | A1* | 1/2013 | Gove | G06F 9/30018<br>712/4 |

* cited by examiner

10

```
Test pattern file

Header Name: Header0

PPPPPPPPPPPPPPPPPPPPPPPPPPPPPPPPPPPPPPPPPPPPPPPPPPPPPPPPPPPPPPPPPPPPP
PPPPP

IIIIIIIIIIIIIIIIIIIIIIIIIIIIIIIIIIIIIIIIIIIIIIIIIIIIIIIIIIIIIIIIIIIII
IIIIIIIIIIIIIIIIIIIIIIIIIIIIIIIIIIIIIIIIIIIIIIIIIIIIIIIIIIIIIIIIIIIII
IIIIIIIIII

NNNNNNNNNNNNNNNNNNNNNNNNNNNNNNNNNNNNNNNNNNNNNNNNNNNNN

000000000000000000000000000000000000000000000000000000000000000001111
111111111111111111111111111111111111111111111111111222222222222222222
222222222222222222222222222222222222222222222222223333333333333333333
333333333333333333333333333333333333333333333333333333344444444444444
44444444444444444444444444444444444444444444444444444555555555555

000000011111122222222333333344444444455555556666666666777777777888888
889999999999000000000111111111222222222233333334444444444455555555666
666667777777777888888999999990000000001111111222222222233333333334444
444444555555566666666677777777778888888889999999000000000111111122222
233333333344444444445555555556666666667777777777888888889999999000001
111111112222222233333333444444444455555555666666666677777777778888888
88999999990000000011

012345678901234567890123456789012345678901234567890123456789012345678
901234567890123456789012345678901234567890123456789012345678901234567
890123456789012345678901234567890123456789012345678901234567890123456
789012345678901234567890123456789012345678901234567890123456789012345
67890123456789012345678901

111111111111111111111111111111111111111111111111111111111111111111111
1111111111111111111111111
   NOOP   %
0000000000000000000000H0000000000000000000000000000000000000000000000
00000000000000000000000000000000000000
   NOOP   %
0000000000000000000000H0000000000000000000000000000000000000000000000
0000000000000000000000000000000000000000000000000000000000000
```

FIG. 2 (PRIOR ART)

Section score table

D = { A A T G C }

| D' | S(i, j) | i=0 | i=1 | i=2 | i=3 | i=4 | i=5 |
|---|---|---|---|---|---|---|---|
| | j=0 | 0 | -1 | -2 | -3 | -4 | -5 |
| A | j=1 | -1 | 0+1=1<br>-1-1=-2<br>-1-1=-2 | -1+1=0<br>-2-1=-3<br>1-1=0 | -2<br>-3-1=-4<br>0-1=-1 | -3<br>-4-1=-5<br>-1-1=-2 | -4<br>-5-1=-6<br>-2-1=-3 |
| T | j=2 | -2 | -1<br>1-1=0<br>-2-1=-3 | 1<br>0-1=-1<br>0-1=-1 | 0+1=1<br>-1-1=-2<br>1-1=0 | -2<br>-3-1=-4<br>1-1=0 | -3<br>-4-1=-5<br>0-1=-1 |
| G | j=3 | -3 | -2<br>0-1=-1<br>-3-1=-4 | 0<br>1-1=0<br>-1-1=-2 | 1<br>1-1=0<br>0-1=-1 | 1+1=2<br>0-1=-1<br>1-1=0 | -2<br>-3-1=-4<br>2-1=1 |
| G | j=4 | -4 | -3<br>-1-1=-2<br>-4-1=-5 | -1=-1<br>0-1=-1<br>-2-1=-3 | 0<br>1-1=0<br>-1-1=-2 | 1+1=2<br>2-1=1<br>0-1=-1 | 2<br>1-1=0<br>2-1=1 |
| C | j=5 | -5 | -4<br>-3-1=-4<br>-5-1=-6 | -3<br>-1-1=-2<br>-4-1=-5 | -1<br>0-1=-1<br>-2-1=-3 | 0<br>2-1=1<br>-1-1=-2 | 2+1=3<br>2-1=1<br>0-1=-1 |

| | |
|---|---|
| First to-be-compared section D | A [A T] G C |
| Second to-be-compared section D' | A [T G] G C |

FIG. 5B

Section score table

| D' = | S(i, j) | i=0 (D = {) | i=1 (A) | i=2 (A) | i=3 (T) | i=4 (G) | i=5 (C }) |
|---|---|---|---|---|---|---|---|
| | j=0 | 0 | -1 | -2 | -3 | -4 | -5 |
| { A | j=1 | -1 | 0+2=2<br>-1<br>-1 | -1+2=1<br>-2<br>2 | -2-1=-3<br>-3<br>2 | -3-1=-4<br>-4<br>2 | -4-1=-5<br>-5<br>2 |
| T | j=2 | -2 | -1-1=-2<br>2<br>-2 | 2-1=1<br>2<br>2 | 2+2=4<br>2<br>2 | 2-1=1<br>2<br>4 | 2-1=1<br>2<br>4 |
| G | j=3 | -3 | -2-1=-3<br>2<br>-3 | 2-1=1<br>2<br>2 | 2-1=1<br>4<br>2 | 4+2=6<br>4<br>4 | 4-1=3<br>4<br>6 |
| G | j=4 | -4 | -3-1=-4<br>2<br>-4 | 2-1=1<br>2<br>2 | 2-1=1<br>4<br>2 | 4+2=6<br>6<br>4 | 6-1=5<br>6<br>6 |
| C } | j=5 | -5 | -4-1=-5<br>2<br>-5 | 2-1=1<br>2<br>2 | 2-1=1<br>4<br>2 | 4-1=3<br>6<br>4 | 6+2=8<br>6<br>6 |

| | |
|---|---|
| First to-be-compared section D | A A T _ G C |
| Second to-be-compared section D' | _ A T G G C |

FIG. 6B

To-be-compared sections

| D | D' |
|---|----|
| A | A  |
| T | T  |
| C | –  |
| G | G  |
| T | T  |
| – | T  |

t1         t1'

Result

| t1 | t1' |
|----|-----|
| A  | A   |
| T  | T   |
| C  | –   |
| G  | G   |
| T  | T   |
| –  | T   |

To-be-compared sections

| D | D' |
|---|----|
| A | A  |
| T | T  |
| C | –  |
| G | G  |
| T | T  |
| T | A  |
| A | A  |
| A | C  |
| C | C  |
| G | T  |

t2         t2'

To-be-compared sections

| D | D' | |
|---|---|---|
| A | A | t1' |
| T | T | |
| C | G | |
| G | T | |
| T | T | |
| T | A | |
| A | A | |
| A | C | |
| C | T | |
| G | ⋯ | |
| ⋯ | | |

t1

Result

| t1 | t1' |
|---|---|
| A | A |
| T | T |
| C | — |
| G | G |
| T | T |
| — | T |

To-be-compared sections

| D | D' |
|---|---|
| A | A |
| T | T |
| C | — |
| G | G |
| T | T |
| T | T   t2' |
| A | A |
| A | A |
| C | C |
| G | C |
| ⋯ | T |
|   | ⋯ |

t2

COMPARISON DEVICE AND METHOD FOR COMPARING TEST PATTERN FILES OF A WAFER TESTER

CROSS REFERENCE TO RELATED APPLICATION

This application is a continuation-in-part (CIP) of U.S. Patent application for "comparison device and method for comparing test pattern files of a wafer tester", U.S. application Ser. No. 12/929,839, filed on Feb. 18, 2011.

BACKGROUND OF THE INVENTION

1. Field of the Invention

The present invention relates to the technical field of file comparison for wafer testing and, more particularly, to a comparison device and method for comparing test pattern files of a wafer tester.

2. Description of Related Art

Currently, for testing wafers, wafer manufacturers typically place a wafer under test inside a wafer tester and a corresponding test pattern file, which is built up according to the wafers under test, is inputted into the wafer tester for executing test procedure. Please refer to FIG. 1, which is a schematic diagram of inputting a test pattern file into a conventional wafer tester. As shown in FIG. 1, the test pattern file 10 is inputted into the wafer tester 1, and the wafer tester 1 generates corresponding analog test waveforms according to the test pattern file 10 for executing test procedure on a wafer under test.

Please refer to FIG. 2, which is a schematic diagram of a conventional test pattern file. The test pattern file 10 is a text file, the content of which is a large amount of words and the file size is greater than 1 GB. Since the test pattern file 10 is built up according the wafer under test, for manufacturers, the corresponding test pattern files should be built up according to different kinds of wafers with different sizes, patterns or functions for testing. In the prior art, a comparison software may be used if it is desired to compare the difference between different test pattern files to execute procedures, such as debugging. However, the comparison speed of the conventional comparison software is related to the file size, and thus the comparison speed may be decreased seriously if file size is too large. Since the file size of the test pattern file is quite large, there is no way to compare two files efficiently in the prior art. Accordingly, errors may occur easily and the time cost is high when comparing the content of files manually, and mistakes in the test pattern file may cause errors on testing, resulting in problems such as reworking, customer complaints, or even indemnity.

Therefore, it is desirable to provide a comparison device and method for comparing test pattern files of a wafer tester to mitigate and/or obviate the aforementioned problems.

SUMMARY OF THE INVENTION

The object of the present invention is to provide a comparison device and method for comparing test pattern files of a wafer tester, which can compare the content of two test pattern files quickly.

According to one aspect, the present invention which achieves the object relates to a comparison device for comparing test pattern files of a wafer tester, which is provided for comparing a first to-be-compared file with a second to-be-compared file, wherein the first to-be-compared file and the second to-be-compared file are text files. The comparison device includes: a computer storage for storing the first to-be-compared file and the second to-be-compared file; and a processor for processing and executing comparison operation for the first to-be-compared file and the second to-be-compared file to generate a comparison result, the comparison operation comparing words in a first section of the first to-be-compared file with words in a second section of the second to-be-compared file in a one-to-one manner, wherein, if it is determined that the first section ending point is not the end of the first to-be-compared file or the second section ending point is not the end of the second to-be-compared file, the processor resets the first section starting point, the first section ending point, the second starting point and the second section ending point, and executes comparison operation again, and wherein locations of the first section starting point and the second section starting point are determined by the processor according to the comparison result and, if it is determined that the first to-be-compared section has a terminal inserting part, a reset location of the first section starting point is in the terminal inserting part and the word on the first section starting point replaces the terminal inserting part.

According to another aspect, the present invention which achieves the object relates to a comparison method for comparing test pattern files of a wafer tester, which is used for comparing a first to-be-compared file with a second to-be-compared file by a computer device, the first to-be-compared file and the second to-be-compared file being text files, the computer device including a computer storage for storing files and a processor for processing and executing comparison operation to generate a comparison result, the comparison operation being to compare words in a first section of the first to-be-compared file with words in a second section of the second to-be-compared file. The comparison method includes the steps of: (A) inputting the first to-be-compared file and the second to-be-compared file into the comparison device; (B) the comparison device storing the first to-be-compared file and the second to-be-compared file into the computer storage; (C) the processor reading the first to-be-compared file and the second to-be-compared file from the computer storage, setting up a first section starting point and a first section ending point in the first to-be-compared file, setting up a second section starting point and a second section ending point in the second to-be-compared file, reading content in-between the first section starting point and the first section ending point as a first to-be-compared section, and reading content in-between the second section starting point and the second section ending point as a second to-be-compared section, executing comparison operation, and generating the comparison result; (D) the processor determining whether the first section ending point is an end of the first to-be-compared file and the second section ending point is an end of the second to-be-compared file and, if yes, finishing the method, otherwise executing step (E); (E) the processor resetting the first section starting point and the first section ending point in the first to-be-compared file, and resetting the second section starting point and the second section ending point in the second to-be-compared file, wherein locations of the first section starting point and the second section starting point are determined by the processor according to the comparison result and, if it is determined that the first to-be-compared section has a terminal inserting part, a reset location of the first section starting point is in the terminal inserting part and the word on the first section starting point replaces the terminal inserting part, and then executing comparison operation and generating the comparison result.

Other objects, advantages, and novel features of the invention will become more apparent from the following detailed description when taken in conjunction with the accompanying drawings.

BRIEF DESCRIPTION OF THE DRAWINGS

FIG. 2 is a schematic diagram of a conventional test pattern file;

FIG. 5A is a schematic diagram of the section score table according to an embodiment of the present invention;

FIG. 5B is a schematic diagram of the comparison result of the section score table according to an embodiment of the present invention;

FIG. 6A is a schematic diagram of the section score table according to another embodiment of the present invention;

FIG. 6B is a schematic diagram of the comparison result of the section score table according to another embodiment of the present invention;

DETAILED DESCRIPTION OF THE PREFERRED EMBODIMENT

Figure 1:
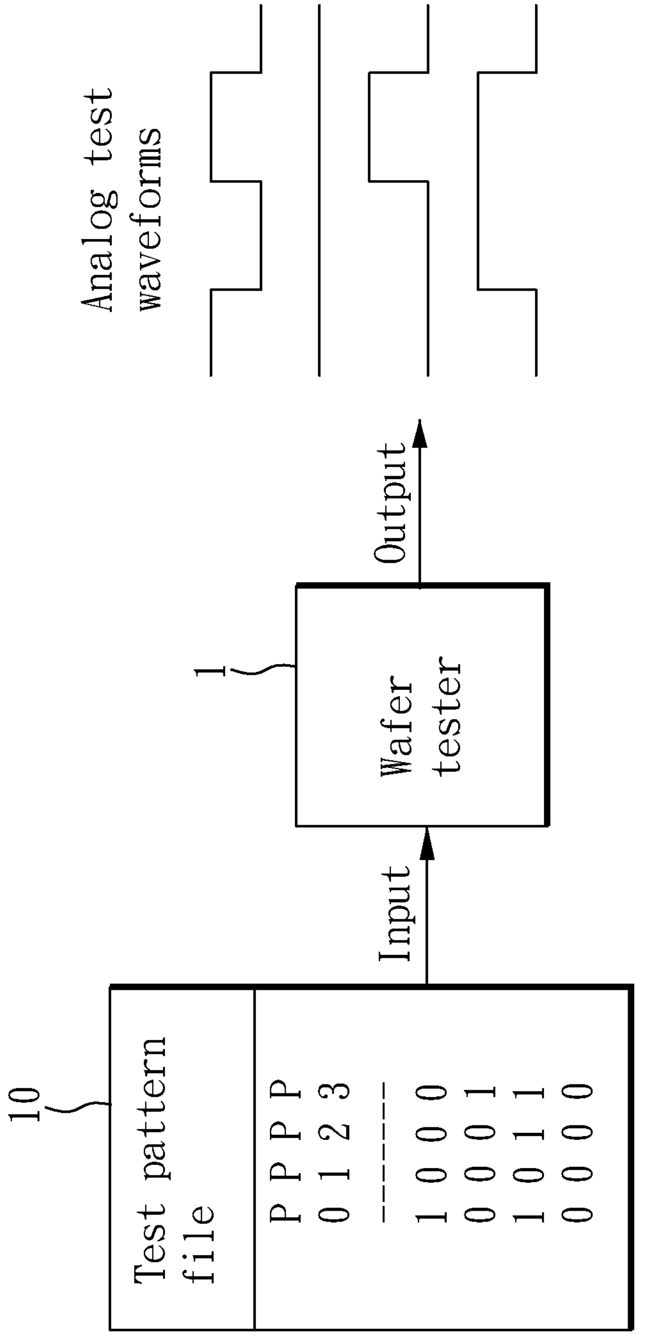
FIG. 1 is a schematic diagram of inputting a test pattern file into a conventional wafer tester.
Figure 3:
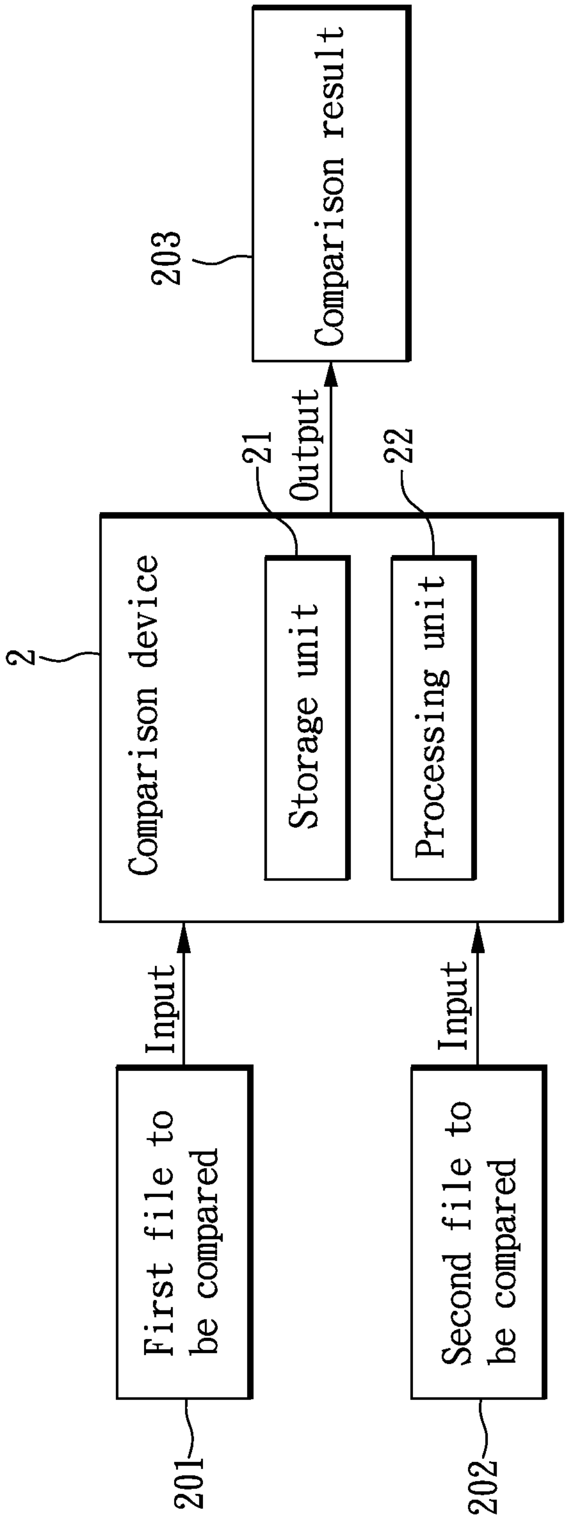
FIG. 3 is a schematic diagram of the comparison device according to an embodiment of the present invention.

With reference to FIG. 3, there is shown a schematic diagram of the comparison device for comparing test pattern files of a wafer tester according to an embodiment of the present invention. As shown in FIG. 3, the comparison device 2 comprises a computer storage 21 and a processor 22, wherein the computer storage 21 is provided for storing a first to-be-compared file 201 and a second to-be-compared file 202 input by users, and the processor 22 is provided for processing and executing comparison operation for the first to-be-compared file 201 and the second to-be-compared file t 202, to thereby generate a comparison result 203. The comparison operation is to compare the words in a first section of the first to-be-compared file 201 with the words in a second section of the second to-be-compared file 202 in a one-to-one manner.

Figure 4:
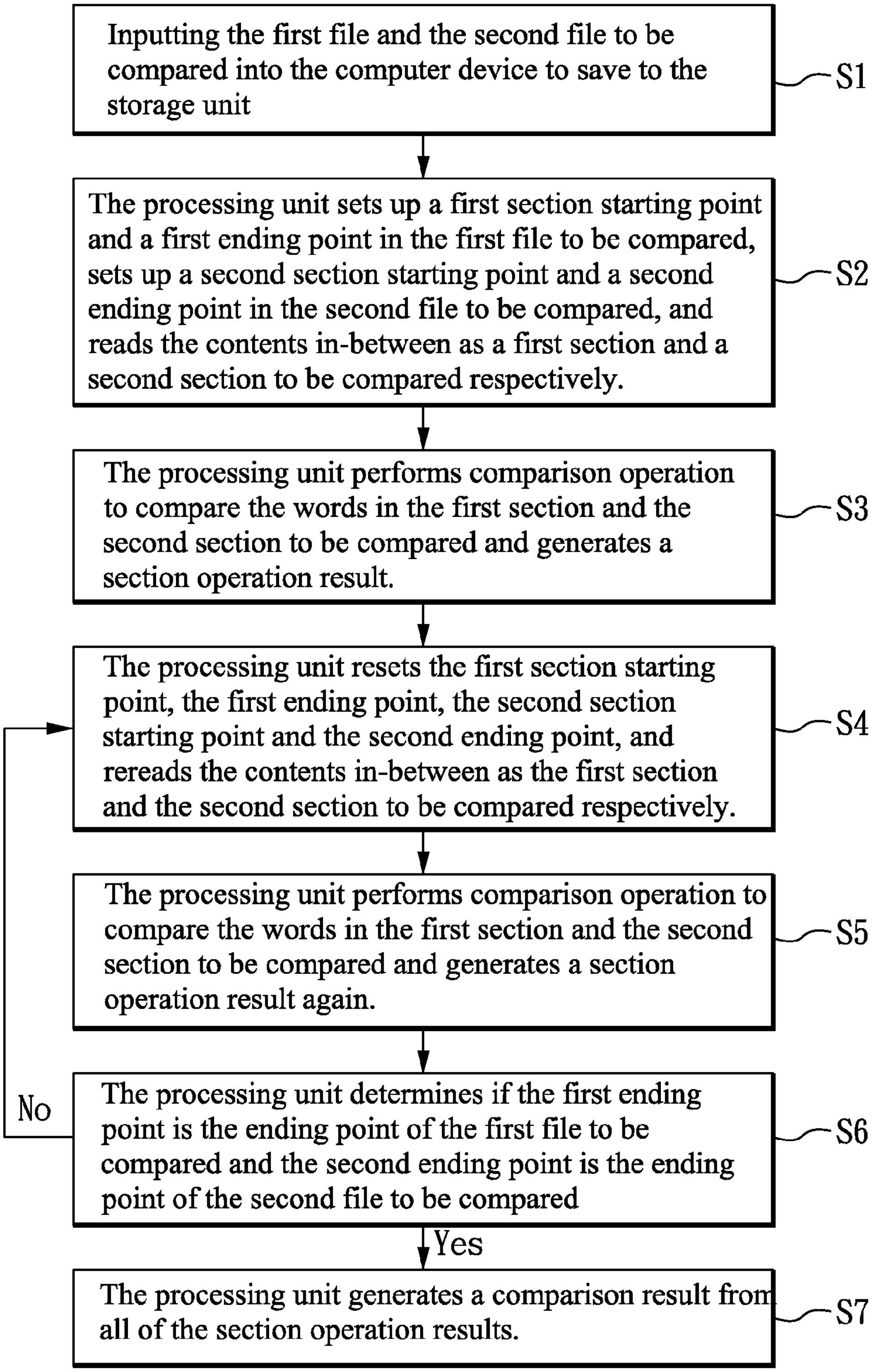
FIG. 4 is a flow chart of the comparison method according to an embodiment of the present invention.

Please refer to FIG. 4, which is a flow chart of the comparison method for comparing test pattern files of a wafer tester according to an embodiment of the present invention. The comparison device 2 is preferably a computer device. When comparing files by the comparison device 2, the first to-be-compared file 201 and the second to-be-compared file 202 are first input into the comparison device 2, wherein the first to-be-compared file 201 and the second to-be-compared file 202 are text files and the file size of each of the first to-be-compared file 201 and the second to-be-compared file 202 can be greater than 1 GB. The comparison device 2 stores the first to-be-compared file 201 and the second to-be-compared file 202 into the computer storage 21 (step S1). The processor 22 sets up a first section starting point and a first section ending point in the first to-be-compared file 201, reads the content in-between the first section starting point and the first section ending point as a first to-be-compared section, sets up a second section starting point and a second section ending point in the second to-be-compared file 202, and reads the content in-between the second section starting point and the second section ending point as a second to-be-compared section, wherein the first section starting point is set up at the start of the first to-be-compared file 201, and the second section starting point is set up at the start of the second to-be-compared file (step S2). The processor 22 compares the words in the first to-be-compared section with the words in the second to-be-compared section in a one-to-one manner, and generates a comparison result (step S3). The processor 22 resets the first section starting point, the first section ending point, the second section starting point and the second section ending point, and reads the content in-between the first section starting point and the first section ending point as a first to-be-compared section, and reads the content in-between the second section starting point and the second section ending point as a second to-be-compared section (step S4). The processor 22 compares the words in the first to-be-compared section with the words in the second to-be-compared section in a one-to-one manner, and generates a comparison result again (step S5). The processor 22 determines whether the first section ending point is the end of the first to-be-compared file and the second section ending point is the end of the second to-be-compared file (step S6); if yes, the processor processes the generated comparison results to generate the comparison result (step S7), otherwise, returning to step S4.

The comparison operation executed for the first to-be-compared section and the second to-be-compared section by the processor 22 is preferably to first generate a section score table according to the words in the first to-be-compared section and the second to-be-compared section. Please refer to FIG. 5A, which is a schematic diagram of the section score table according to an embodiment of the present invention. As shown in FIG. 5A, the first to-be-compared section D is AATGC, and the second to-be-compared section D' is ATGGC. The processor 22 compares the words in the first to-be-compared section D with the words in the second to-be-compared section D' in a one-to-one manner, and fills comparison results in the section score table.

In this embodiment, the processor 22 compares the words in the first to-be-compared section D with the words in the second to-be-compared section D' in a one-to-one manner according to the following equation for providing the comparison result of the shortest path:

$$S(i,0)=0-i,$$

$$S(0,j)=0-j,$$

$$S(i,j)=\text{Max}\begin{cases} S(i-1,j-1)+1 & \text{if } D(i)=D'(j)\\ S(i-1,j-1) & \text{if } D(i)\neq D'(j)\\ S(i,j-1)-1 & \\ S(i-1,j)-1 & \end{cases},$$

$$i=1,2,3,\ldots$$

$$j=1,2,3\ldots$$

where i is the ordinal number of the words in the first to-be-compared section, j is the ordinal number of the words in the second to-be-compared section, S(i, j) is the numbers, D(i) and D'(j) are the contents of the first to-be-compared section D and the second to-be-compared section D' respectively, and the source direction indexes are one-to-one mapping to the numbers to record a source direction of the numbers S(i, j).

First, S(1, 1) is calculated by substituting i=1 and j=1 into the above equation:

$$S(1,1)=\text{Max}\begin{cases} S(0,0)+1 & \text{if } D(1)=D'(1)\\ S(0,0) & \text{if } D(1)\neq D'(1)\\ S(1,0)-1 & \\ S(0,1)-1 & \end{cases},$$

where $D(1)=A$, $D'(1)=A$, i.e. $D(1)=D'(1)$.

$$\Rightarrow S(1,1)=\text{Max}\begin{cases} 0+1=1\\ -1-1=-2\\ -1-1=-2 \end{cases}$$

$$\Rightarrow S(1,1)=1$$

Therefore, S(1, 1) is calculated as 1.

Next, S(1, 2) is calculated by substituting i=1 and j=2 into the above equation:

$$S(1,2)=\text{Max}\begin{cases} S(0,1)+1 & \text{if } D(1)=D'(2)\\ S(0,1) & \text{if } D(1)\neq D'(2)\\ S(1,1)-1 & \\ S(0,2)-1 & \end{cases},$$

where $D(1)=A$, $D'(2)=T$, i.e. $D(1)\neq D'(2)$.

$$\Rightarrow S(1,2)=\text{Max}\begin{cases} -1\\ 1-1=0\\ -2-1=-3 \end{cases}$$

$$\Rightarrow S(1,2)=0$$

Thus, S(1, 2) is calculated as 1.

In the operation process of the section score table, the processor 22 preferably compares each word D(i) in the first to-be-compared section with each word D'(j) in the second to-be-compared section, then uses a flag array to record whether they are the same or not, and calculates all of the S(i, j) according to the flag array.

The processor 22 calculates the values of S(1, 1) to S(5, 5) respectively according to the above operation process and stores them to a number array. The processor 22 simultaneously determines the corresponding direction index P(i, j) according to the calculated values of S(i,j) during the operation process, and stores the direction indexes P(i, j) to a direction array. For example, S(1, 2)=0 is calculated from the value of S(1, 1) according to the equation and the above operation process, thus, the corresponding direction index P(1, 2) points to S(1, 1).

Next, the processor 22 generates a comparison result according to the calculated S(i, j) and the corresponding direction index P(i, j). The comparison result is a section backtracking path, which backtracks from the lower right corner of the section score table; i.e., P(5, 5) points to S(4, 4), P(4, 4) points to S(3, 3), P(3, 3) points to S(2, 2), and P(2, 2) points to S(1, 1), so that the section backtracking path of the comparison operation can be obtained. With reference to FIG. 5B, which is a schematic diagram of the comparison result of the section score table according to an embodiment of the present invention. As shown in FIG. 5B, the differences of the first to-be-compared section D and the second to-be-compared section D' are directly marked in the comparison result of this embodiment.

Please refer to FIG. 6A, which is a schematic diagram of the section score table according to another embodiment of the present invention. The processor 22 executes comparison operation for the first to-be-compared section D and the second to-be-compared section D' according to the following equation for providing the comparison result of the best insertion:

$$S(i,0)=0-i,$$

$$S(0,j)=0-j,$$

$$S(i,j)=\text{Max}\begin{cases} S(i-1,j-1)+2 & \text{if } D(i)=D'(j)\\ S(i-1,j-1)-1 & \text{if } D(i)\neq D'(j)\\ S(i,j-1) & \\ S(i-1,j) & \end{cases},$$

$$i=1,2,3,\ldots$$

$$j=1,2,3\ldots$$

The processor 22 calculates the values of S(1, 1) to S(5, 5), determines the direction indexes P(1, 1) to P(5, 5) according to the calculated values, generates the backtracking path and obtains the comparison result. With reference to FIG. 6B, which is a schematic diagram of the comparison result of the section score table according to another embodiment of the present invention. As shown in FIG. 6B, the word insertion points in the first to-be-compared section D and the second to-be-compared section D' are marked in the comparison result of this embodiment.

The comparison method according to the present invention respectively cuts two to-be-compared files into multiple to-be-compared sections and compares the sections in a one-to-one manner. Thus, the comparison speed does not decrease quickly with the increasing of the file size. However, the file connection between the cut to-be-compared sections may cause discontinuity in the comparison result, and thus reduce the comparison accuracy. Therefore, the comparison method of the present invention performs a determination on the comparison result for adjusting the position of the section starting point when resetting the to-be-compared section, so as to avoid comparison accuracy reduction caused by discontinuity.

Figure 7A:
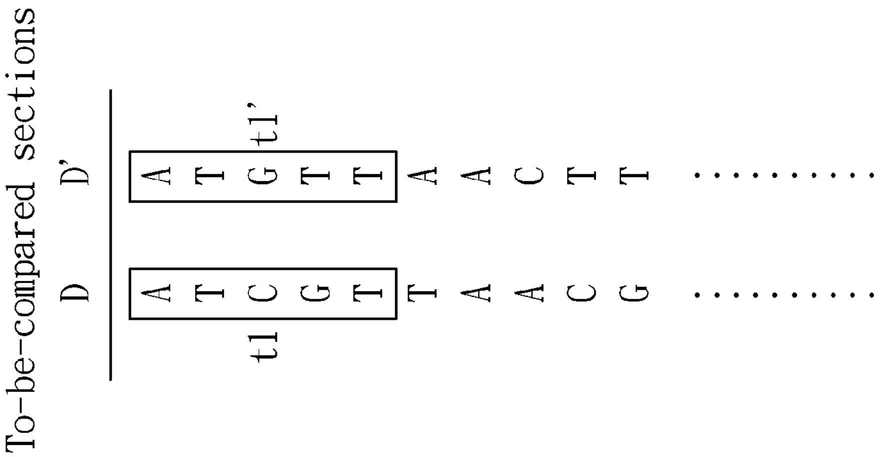
FIG. 7A is a schematic diagram of setting up the to-be-compared sections in the two to-be-compared files.
Figure 7B:
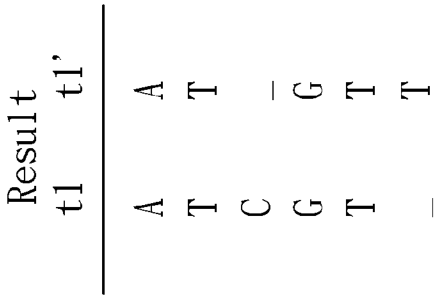
FIG. 7B is a schematic diagram of a comparison result of the two to-be-compared sections.
Figure 7C:
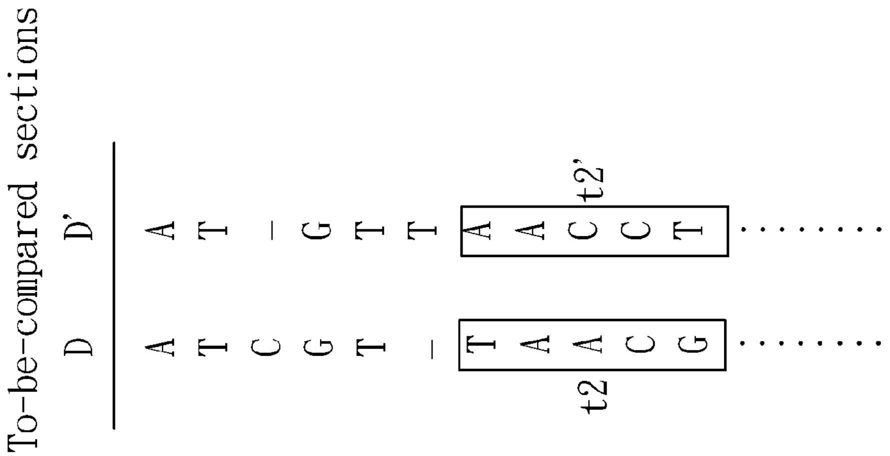
FIG. 7C schematically illustrates further data of the to-be-compared files discontinued with the comparison result.

FIGS. 7A to 7C are schematic diagrams of the discontinuity, wherein FIG. 7A is a schematic diagram of to-be-compared sections of two to-be-compared files, FIG. 7B is a schematic diagram of a comparison result of the two to-be-compared sections, and FIG. 7C schematically illustrates further data of the to-be-compared files discontinued with the comparison result. As shown in FIG. 7A, the first to-be-compared file D has the words of "ATCGTTAACG . . . "; the second to-be-compared file D' has the words of "ATGTTAACTT . . . "; the processor 22 sets up the first to-be-compared section t1 in the first to-be-compared file D; the first to-be-compared section t1 has words of "ATCGT"; the processor 22 sets up the first to-be-compared section t1' in the first to-be-compared file D'; the first to-be-compared section t1' has words of "ATGTT", i.e., the start point of the first to-be-compared section t1 is the first word of the first to-be-compared file D; the start point of the second to-be-compared section t1' is the first word of the second to-be-compared file D'. Then, the processor 22 compares the words in the first to-be-compared section t1 with the words in the second to-be-compared section t1' in a one-to-one manner, so as to generate a comparison result. After the comparison using the best insertion method, as shown in FIG. 7B, the terminal of the second to-be-compared section t1 generates a terminal inserting part parallel to the last word "T" of the second to-be-compared section t1'. Then, as shown in FIG. 7C, the processor 22 inserts the continued to-be-compared words "TAACG . . . " of the first to-be-compared file D after the terminal inserting part and inserts the continued to-be-compared words "AACTT . . . " after the last word "T" of the second terminal section t1', and resets the first to-be-compared section t2 and the second to-be-compared section t2', wherein, the new first to-be-compared section t2 has the words of "TAACG", and the new second to-be-compared section t2' has the words of "AACTT". Thus, due to using the best insertion method, the connection part of the terminal inserting part and the continued to-be-compared words result in the discontinuity.

Figure 8A:
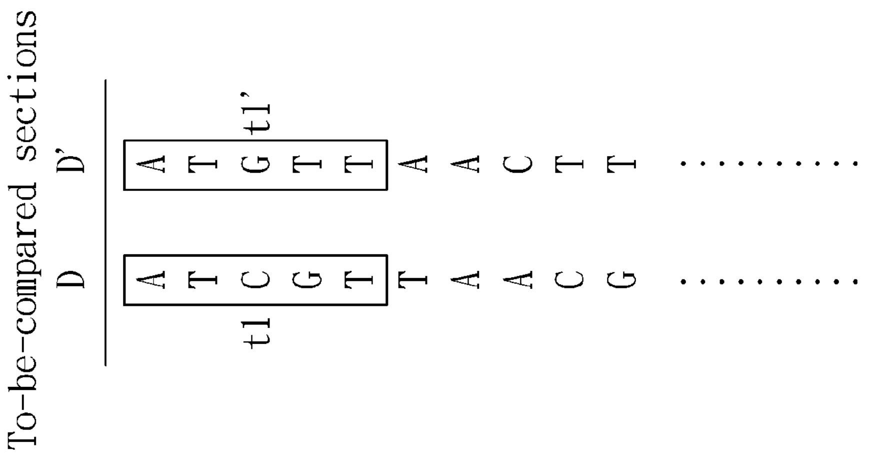
FIG. 8A is a schematic diagram of setting up the to-be-compared sections in the two to-be-compared files according to a preferred embodiment of the invention.
Figure 8B:
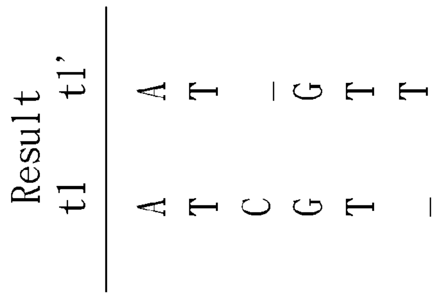
FIG. 8B is schematic diagram of a comparison result of the two to-be-compared sections according to a preferred embodiment of the invention.
Figure 8C:
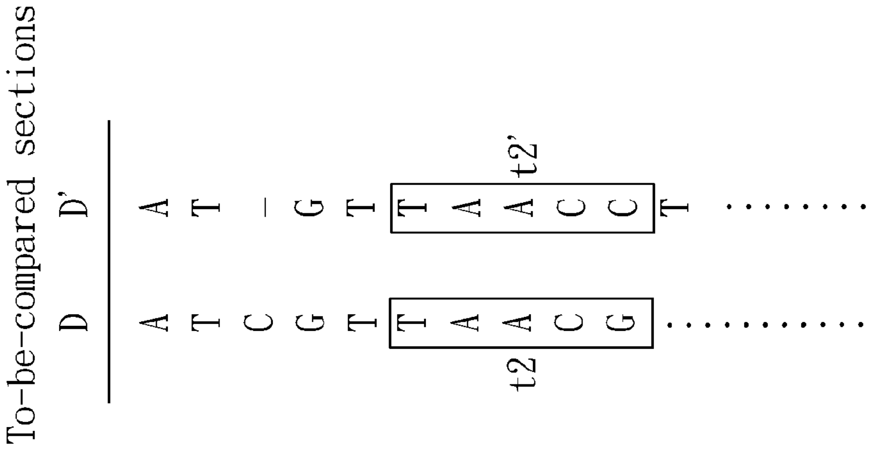
FIG. 8C schematically illustrates further data of the to-be-compared files continued with the comparison result according to a preferred embodiment of the invention.

FIGS. 8A to 8C are schematic diagrams of an improved type of the connection parts according to a preferred embodiment of the invention, wherein FIG. 8A is a schematic diagram of setting up the to-be-compared sections in the two to-be-compared files, FIG. 8B is a schematic diagram of the comparison result of the two to-be-compared sections, and FIG. 8C is a schematic diagram of resetting the to-be-compared sections in the two to-be-compared files according to a further embodiment of the present invention. In FIG. 8A, similar to FIG. 7A, the first to-be-compared file D has the words of "ATCGTTAACG . . . "; the second to-be-compared file D' has the words of "ATGTTAACTT . . . "; the processor 22 sets up the first to-be-compared section t1 in the first to-be-compared file D, and sets up the second to-be-compared section t1' in the second to-be-compared file D', wherein the first section starting point is the start of the first to-be-compared file D, and the second section starting point is the start of the second to-be-compared file D'. The processor 22 compares the words in the first to-be-compared section t1 with the words in the second to-be-compared section t1' in a one-to-one manner, so as to generate a comparison result. In FIG. 8B, similar to FIG. 7B, it shows the comparison result of using the best insertion method to perform comparison operation on the first to-be-compared section t1 and the second to-be-compared section t1' by the processor 22, wherein the comparison result of the first to-be-compared section t1 has a terminal inserting part parallel to the last word "T" of the second terminal section t1'. Then, as shown in FIG. 8C, the processor 22 inserts the continued to-be-compared words "TAACG . . . " of the first to-be-compared file D into the terminal inserting part and inserts the continued to-be-compared words "AACTT . . . " after the last word "T" of the second terminal section t1', so that the terminal inserting part can be replaced. Then, the processor 22 resets the first to-be-compared section t2 and the second to-be-compared section t2', wherein the new first to-be-compared section t2 has the words of "TAACG". Different from FIG. 7C, due to the start point of the new second to-be-compared section t2' is the last word "T" of the second to-be-compared section t1', the second to-be-compared section t1' has the words of "TRACT". Thus, the discontinuity on the terminal inserting part can be avoided.

Figure 9:
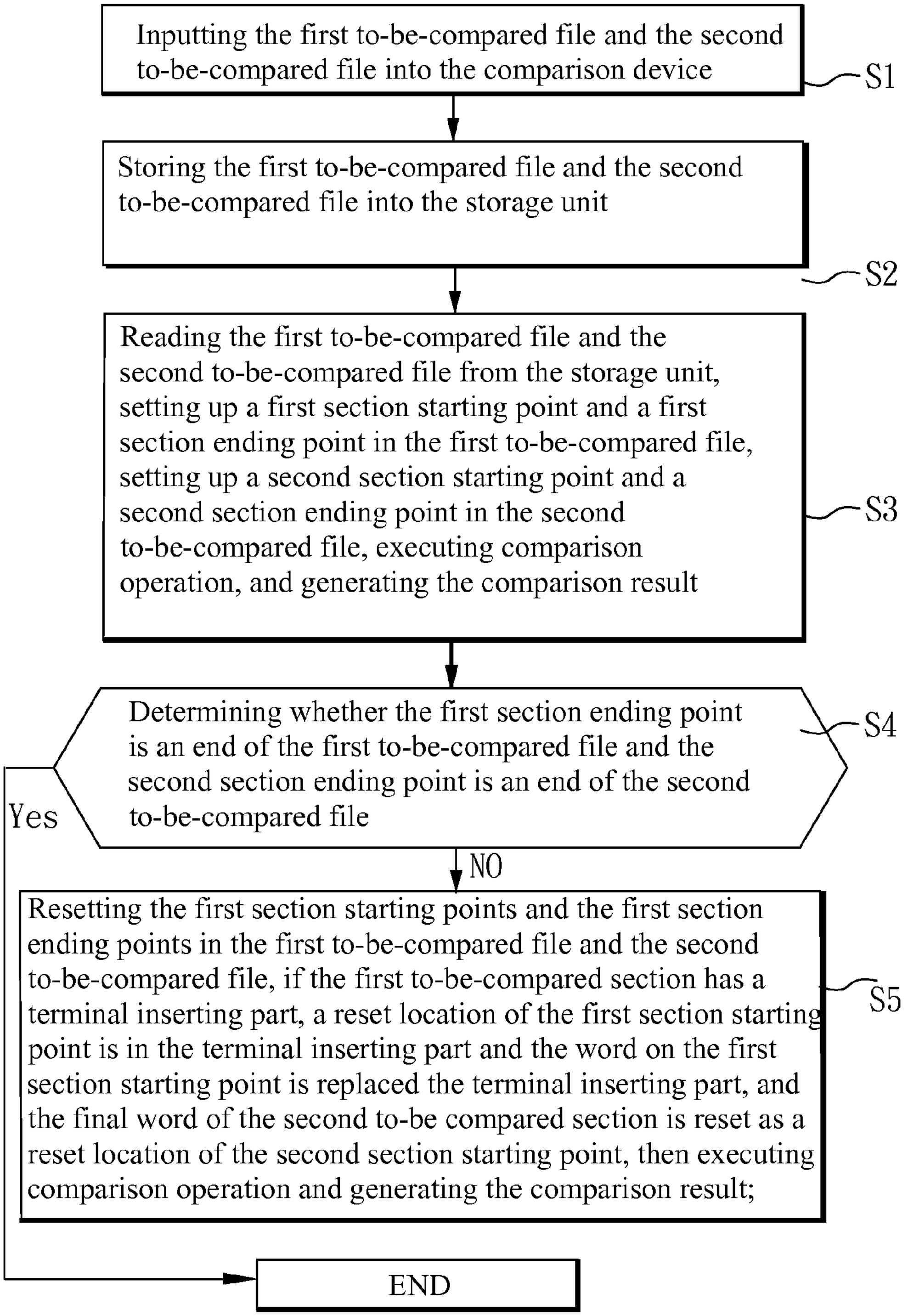
FIG. 9 is a flow chart of a further comparison method for comparing test pattern files of a wafer tester according to the embodiment in FIGS. 8A, 8B and 8C of the present invention.

FIG. 9 is a flow chart of a further comparison method for comparing test pattern files of a wafer tester according to the embodiment in FIGS. 8A, 8B and 8C of the present invention. In step (S1), inputting the first to-be-compared file and the second to-be-compared file into the comparison device; then in step (S2), the comparison device storing the first to-be-compared file and the second to-be-compared file into the computer storage; then in step (S3), the processor reading the first to-be-compared file and the second to-be-compared file from the computer storage, setting up a first section starting point and a first section ending point in the first to-be-compared file, setting up a second section starting point and a second section ending point in the second to-be-compared file, executing comparison operation, and generating the comparison result; then in step (S4), the processor determining whether the first section ending point is an end of the first to-be-compared file and the second section ending point is an end of the second to-be-compared file and, if yes, finishing the method, otherwise executing step (S5); in step (S5), the processor resetting the first section starting point and the first section ending point in the first to-be-compared file, and resetting the second section starting point and the second section ending point in the second to-be-compared file according the comparison result in step (S3), i.e., locations of the first section starting point and the second section starting point are determined by the processor according to the comparison result. If it is determined that the comparison result of the first to-be-compared section has a terminal inserting part and the comparison result of the second to-be-compared section has no terminal inserting part, a reset location of the first section starting point is in the terminal inserting part and the word on the reset location of the first section starting point replaces the terminal inserting part, and the final word of the second to-be-compared section is reset as a reset location of the second section starting point. Thus, the two to-be-compared section (t1 and t2, or t1' and t2') are continued, so the method also performs a determination on the comparison result for adjusting the position of the section starting point when resetting the to-be-compared section, so as to avoid comparison accuracy reduction caused by discontinuity.

Besides, step (S5) of the methods of FIG. 9 can further include the processor generating a section score table according to the words in the first to-be-compared section and the second to-be-compared section, executing comparison operation respectively and filling comparison result in the section score table, and building up a comparison result, which is a section backtracking path.

Figure 10:
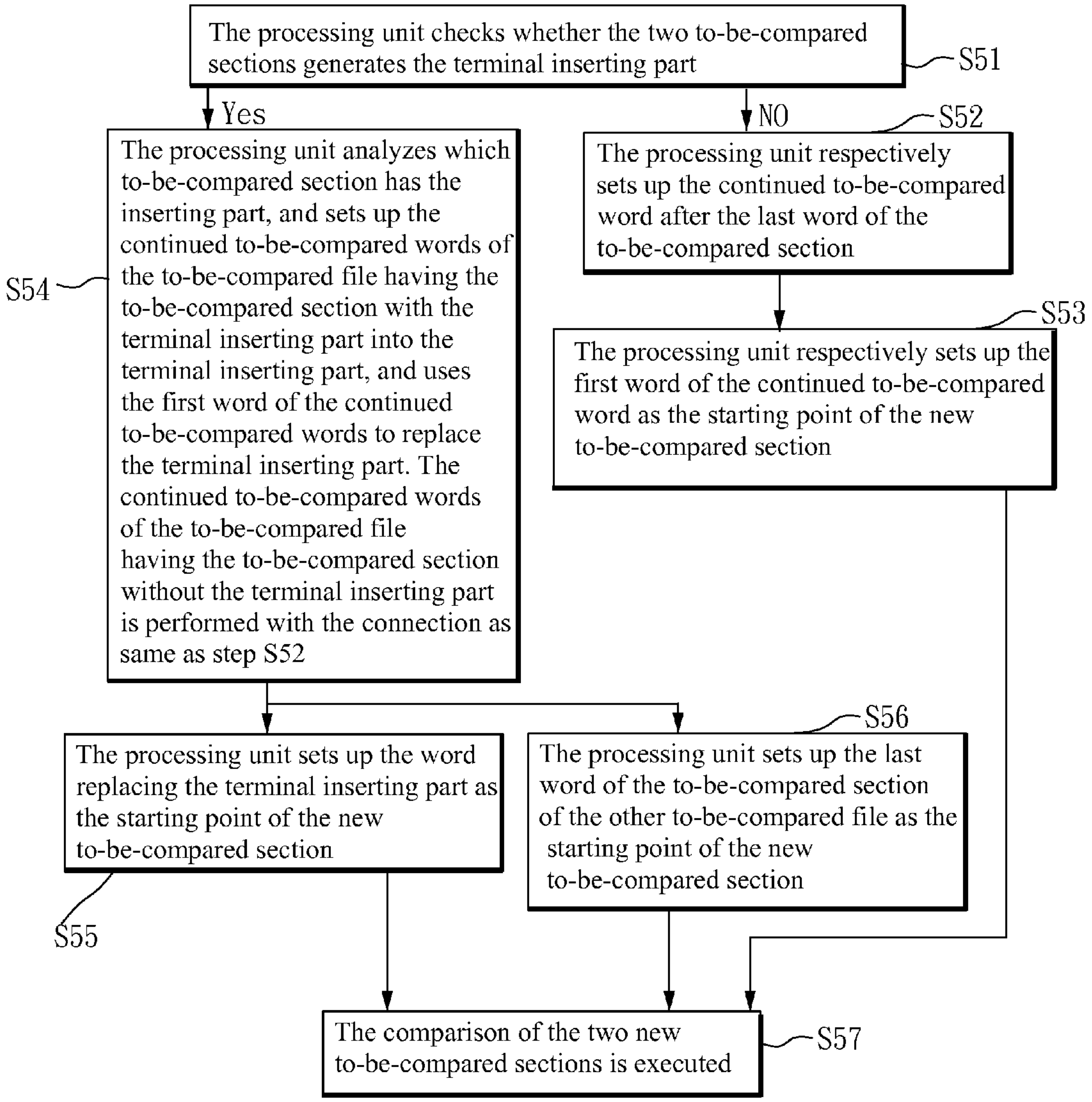
FIG. 10 is a detailed flow chart of step (S5) of FIG. 9 of the present invention.

FIG. 10 is a detailed flow chart of step (S5) of FIG. 9. First, step (S51) is executed, and the processor 22 checks whether the comparison results of the two to-be-compared sections generates the terminal inserting part via the best inserting method. If no, step (S52) is executed, and the processor 22 respectively sets up the continued to-be-compared word after the last word of the comparison result of the to-be-compared section. Then, step (S53) is executed, and the processor 22 respectively sets up the first word of the continued to-be-compared word as the starting point of the new to-be-compared section. If the determination of step (S51) is affirmative, step (S54) is executed, and the processor 22 analyzes which to-be-compared section has the inserting part, sets up the continued to-be-compared words of the to-be-compared file having the to-be-compared section with the terminal inserting part into the terminal inserting part, and uses the first word of the continued to-be-compared words to replace the terminal inserting part. The continued to-be-compared words of the to-be-compared file having the to-be-compared section without the terminal inserting part is performed with the connection as same as step (52). Then, step (S55) is executed, the processor 22 sets up the word replacing the terminal inserting part as the starting point of the new to-be-compared section. At the same time, step (S56) is executed, and the processor 22 sets up the last word of the to-be-compared section of the other to-be-compared file as the starting point of the new to-be-compared section. Then, step (S57) is executed, and the comparison of the two new to-be-compared sections is executed.

Comparing FIG. 7C and FIG. 8C, the improved connection type of the invention can maintain the continuity of the to-be-compared file and thus keep excellent comparison speed.

The comparison method of the present invention is provided for quickly and effectively performing comparison on two text files with large file size, which respectively cuts two to-be-compared files into multiple to-be-compared sections and compares the words in them sequentially; hence, the comparison speed does not decrease quickly with increasing of the file size. In addition, the comparison method of the present invention performs a determination on the comparison result, so as to adjust the position of the section starting point of the reset to-be-compared section, so as to avoid comparison accuracy reduction caused by discontinuity.

Since the differences between two different test pattern files can be quickly marked, performing comparison operation of the present invention is really helpful for wafer manufacturers to control files, such as the test pattern files with different versions.

In addition, when performing comparison operation of the present invention, users can choose to use the method of the shortest path or the best insertion according to comparison conditions, such as file property and comparison purpose, and users can also adjust required comparison accuracy and choose performing a global comparison or a difference comparison.

Although the present invention has been explained in relation to its preferred embodiment, it is to be understood that many other possible modifications and variations can be made without departing from the spirit and scope of the invention as hereinafter claimed.

What is claimed is:

1. A comparison device for comparing test pattern files of a wafer tester, which is provided for comparing a first to-be-compared file with a second to-be-compared file, wherein the first to-be-compared file and the second to-be-compared file are text files, the comparison device comprising:

a computer storage for storing the first to-be-compared file and the second to-be-compared file; and a hardware processor for reading the computer storage and processing and executing comparison operation for the first to-be-compared file and the second to-be-compared file to generate a comparison result, the comparison operation comparing words in a first section having a first section starting point and a first section ending point of the first to-be-compared file with words in a second section having a second section starting point and a second section ending point of the second to-be-compared file in a one-to-one manner, wherein, when it is determined that the first section ending point is not the end of the first to-be-compared file or the second section ending point is not the end of the second to-be-compared file, the hardware processor resets the first section starting point, the first section ending point, the second section starting point and the second section ending point, and executes comparison operation again, and wherein locations of the first section starting point and the second section starting point are determined by the hardware processor according to the comparison result and, when it is determined that the comparison result of the first to-be-compared section has a terminal inserting part, a reset location of the first section starting point is in the terminal inserting part and the word on the reset location of the first section starting point replaces the terminal inserting part, wherein the comparison operation executed for the first to-be-compared section and the second to-be-compared section is to generate a section score table according to the words in the first to-be-compared section and the second to-be-compared section first, execute comparison operation respectively and fill the comparison result in the section score table, and the hardware processor builds up a comparison result, which is a section backtracking path.

2. The comparison device as claimed in claim 1, wherein, when it is determined that the comparison result of the first to-be-compared section has a terminal inserting part and the comparison result of the second section has no terminal inserting part, the final word of the second section is reset as a reset location of the second section starting point.

3. The comparison device as claimed in claim 1, wherein the first section starting point is a start of the first to-be-compared file, and the second section starting point is a start of the second to-be-compared file.

4. The comparison device as claimed in claim 1 wherein the hardware processor further performs a determination on the comparison result and, when it is determined that the first section ending point is an end of the first to-be-compared file and the second section ending point is an end of the second to-be-compared file, the hardware processor processes the generated comparison result to generate the comparison result.

5. The comparison device as claimed in claim 1, wherein the first to-be-compared file and the second to-be-compared file each have a file size greater than 1 GB.

6. The comparison device as claimed in claim 1, wherein the hardware processor performs comparison operation for the first to-be-compared section and the second to-be-compared section according to an equation, and the comparison result is stored as a number array and a direction array based on which the section backtracking path is generated, and wherein the number array includes multiple numbers, the direction array includes multiple source direction indexes, the equation is used for calculating the numbers, and the source direction indexes are determined from the calculated numbers.

7. The comparison device as claimed in claim 6, wherein the equation is:

$$S(i,0)=0-i,$$

$$S(0,j)=0-j,$$

$$S(i,j)=\text{Max}\begin{cases}S(i-1,j-1)+2 & \text{if } D(i)=D'(j)\\ S(i-1,j-1)-1 & \text{if } D(i)\neq D'(j)\\ S(i,j-1)\\ S(i-1,j)\end{cases},$$

$$i=1,2,3,\ldots$$

$$j=1,2,3\ \ldots,$$

where i is an ordinal number of the words in the first to-be-compared section, j is an ordinal number of the words in the second to-be-compared section, S(i, j) is the numbers, and D(i) and D'(j) are contents of the first to-be-compared section and the second to-be-compared section respectively; the source direction indexes are one-to-one mapping to the numbers to record a source direction of the numbers S(i, j).

8. The comparison device as claimed in claim 7, wherein a flag array is provided for recording whether the words in the first to-be-compared section and the second to-be-compared section are the same or not for allowing the hardware processor to execute operation.

9. A comparison method for comparing test pattern files of a wafer tester, which is executed to compare a first to-be-compared file with a second to-be-compared file by a computer device, the first to-be-compared file and the second to-be-compared file being text files, the computer device including a computer storage for storing files and a processor for processing and executing comparison operation to generate a comparison result, the comparison operation being to compare words in a first section of the first to-be-compared file with words in a second section of the second to-be-compared file, the comparison method comprising the steps of:

(A) inputting the first to-be-compared file and the second to-be-compared file into the comparison device;

(B) the comparison device storing the first to-be-compared file and the second to-be-compared file into the computer storage;

(C) the processor reading the first to-be-compared file and the second to-be-compared file from the computer storage, setting up a first section starting point and a first section ending point in the first to-be-compared file, setting up a second section starting point and a second section ending point in the second to-be-compared file, executing comparison operation, and generating the comparison result;

(D) the processor determining whether the first section ending point is an end of the first to-be-compared file and the second section ending point is an end of the second to-be-compared file and, when yes, finishing the method, otherwise executing step (E);

(E) the processor resetting the first section starting point and the first section ending point in the first to-be-compared file, and resetting the second section starting point and the second section ending point in the second to-be-compared file, wherein locations of the first section starting point and the second section starting point are determined by the processor according to the comparison result and, when it is determined that the comparison result of the first to-be-compared section has a terminal inserting part, a reset location of the first section starting point is in the terminal inserting part and the word on the reset location of the first section starting point replaces the terminal inserting part, and then executing comparison operation and generating the comparison result;

wherein step (C) further comprises the step of:

the processor generating a section score table according to the words in the first to-be-compared section and the second to-be-compared section, executing comparison operation respectively and filling comparison result in the section score table, and building up a comparison result, which is a section backtracking path.

10. The comparison method as claimed in claim 9, wherein step (E) further comprises the step of: (E1) when it is determined that the comparison result of the first to-be-compared section has a terminal inserting part and the comparison result of the second to-be-compared section has no terminal inserting part, the final word of the second to-be-compared section is reset as a reset location of the second section starting point.

11. The comparison device as claimed in claim 9, wherein the comparison operation executed for the first to-be-compared section and the second to-be-compared section is to generate a section score table according to the words in the first to-be-compared section and the second to-be-compared section first, execute comparison operation respectively and fill the comparison result in the section score table, and the processor builds up a comparison result, which is a section backtracking path.

12. The comparison device as claimed in claim 11, wherein the processor performs comparison operation for the first to-be-compared section and the second to-be-compared section according to an equation, and the comparison result is stored as a number array and a direction array based on which the section backtracking path is generated, and wherein the number array includes multiple numbers, the direction array includes multiple source direction indexes, the equation is executed to calculate the numbers, and the source direction indexes are determined from the calculated numbers.

13. The comparison device as claimed in claim 12, wherein the equation is:

$$S(i,0)=0-i,$$

$$S(0,j)=0-j,$$

$$S(i,j)=\text{Max}\begin{cases}S(i-1,j-1)+2 & \text{if } D(i)=D'(j)\\ S(i-1,j-1)-1 & \text{if } D(i)\neq D'(j)\\ S(i,j-1)\\ S(i-1,j)\end{cases},$$

$$i=1,2,3,\ldots$$

$$j=1,2,3\ \ldots,$$

where i is an ordinal number of the words in the first to-be-compared section, j is an ordinal number of the words in the second to-be-compared section, S(i, j) represents the numbers, and D(i) and D'(j) are contents of the first to-be-compared section and the second to-be-compared section respectively; the source direction indexes are one-to-one mapping to the numbers to record a source direction of the numbers S(i, j).

* * * * *